(12) United States Patent
Peng et al.

(10) Patent No.: US 12,020,600 B2
(45) Date of Patent: Jun. 25, 2024

(54) FLEXIBLE DISPLAY PANEL AND MANUFACTURING METHOD THEREFOR

(71) Applicant: WUHAN CHINA STAR OPTOELECTRONICS SEMICONDUCTOR DISPLAY TECHNOLOGY CO., LTD., Hubei (CN)

(72) Inventors: Simin Peng, Hubei (CN); Jiangjiang Jin, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 510 days.

(21) Appl. No.: 17/278,340

(22) PCT Filed: Dec. 11, 2018

(86) PCT No.: PCT/CN2018/120420
§ 371 (c)(1),
(2) Date: Mar. 22, 2021

(87) PCT Pub. No.: WO2020/113625
PCT Pub. Date: Jun. 11, 2020

(65) Prior Publication Data
US 2022/0036771 A1      Feb. 3, 2022

(30) Foreign Application Priority Data

Dec. 3, 2018   (CN) .......................... 201811468712.0

(51) Int. Cl.
G09F 9/30       (2006.01)
G03F 7/00       (2006.01)

(52) U.S. Cl.
CPC ............ *G09F 9/301* (2013.01); *G03F 7/0007* (2013.01)

(58) Field of Classification Search
CPC ..... G09F 9/301; G03F 7/0007; B32B 27/365; B32B 15/092; B32B 27/38; B32B 15/082
See application file for complete search history.

(56) References Cited

U.S. PATENT DOCUMENTS

2014/0097408 A1*   4/2014   Kim ..................... H10K 59/131
                                                            257/40
2016/0226021 A1*   8/2016   Lee ........................ H10K 50/84

FOREIGN PATENT DOCUMENTS

CN         107564415         1/2018
CN         207116427         3/2018
(Continued)

*Primary Examiner* — David Sample
*Assistant Examiner* — Donald M Flores, Jr.

(57) ABSTRACT

A flexible display panel and a manufacturing method therefor. The flexible display panel comprises an organic insulating layer and a metal layer disposed on the organic insulating layer, and is divided into a display region located in the middle, a binding region located outside the display region, and a bending region located between the display region and the binding region. The organic insulating layer is provided with a plurality of protrusions in the bending region so that the surface of the organic insulating layer is uneven in the bending region. The metal layer comprises a plurality of metal wires penetrating the bending region, and each metal wire covers a part the protrusions of the organic insulating so that the surface the metal wire is also uneven along with the organic insulating layer. During the bending of the flexible display panel, the protrusions would release part of stress.

8 Claims, 6 Drawing Sheets

(56) References Cited

FOREIGN PATENT DOCUMENTS

| CN | 108022942 | 5/2018 |
| CN | 108039120 | 5/2018 |
| CN | 108831908 | 11/2018 |

* cited by examiner

FLEXIBLE DISPLAY PANEL AND MANUFACTURING METHOD THEREFOR

RELATED APPLICATIONS

This application is a National Phase of PCT Patent Application No. PCT/CN2018/120420 having International filing date of Dec. 11, 2018, which claims the benefit of priority of Chinese Patent Application No. 201811468712.0 filed on Dec. 3, 2018. The contents of the above applications are all incorporated by reference as if fully set forth herein in their entirety.

FIELD AND BACKGROUND OF THE INVENTION

Field

The present disclosure relates to a technical field of display devices, and more particularly to a flexible display panel and manufacturing method therefor.

Background

A flexible display is a deformable and bendable display device. The bending function of the display screen do not affect the display function of the display screen. Compared with a traditional hard display screen, the flexible display screen has advantages of light, small size, better flexibility, low power consumption, and the like. The flexible display screen can be designed as electronic products with various properties, such as curved televisions, curled electronic watches, flexible mobile phones, and the like. Although breakthrough progress has been made in terms of flexible technology, there are a number of challenges.

The narrow border of the display device, even without the border, is the mainstream development trend of the current display technology. For the flexible display product, as the flexible display product is made on the bendable and flexible carrier, a narrow border design of a binding region needs to be achieved by bending an edge of the carrier when the display screen with the narrow border is manufactured, and a bending radius of the edge is very small.

When bending the binding region to the rear side of a display surface, there is a bending region between the binding region and a display region. Since a plurality of metal lead wires for transmitting signals are arranged between the binding region and the display region, each of the metal leads passes through the bending region. As the bending degree gradually increases, the metal lead wires in the bending region is easily cracked due to the stress in a vertical direction perpendicular to the bending region, thereby causing poor signal transmission and affecting normal display of the flexible display product.

For example, Apple company provides a structure diagram of a pad region disclosed by U.S. Pat. No. 9,195,108B2, and the binding region is bent backwards relative to an active area (AA) of the display surface, the metal lead wires are located in the bending region for connecting the AA with driving circuits and transmitting electric signals to enable the AA area to emit light for display.

In order to reduce the distance between the display region and a screen boundary, when a display screen with a narrow border is manufactured, the pad region can be bent by 180 degrees, such as a display screen structure disclosed by LG company in the U.S. Pat. No. 9,740,035B2. The stress of the bending region is maximized, a number of metal lead wires are arranged, and the metal lead wires are very sensitive to mechanical force. If the bending occurs in an area of the wires arrangement, the high-strength stretching can cause the wires to crack and influence the service life of the display products.

Therefore, there is a need for a method to reduce stress of the bending region wire, thereby increasing its flexibility and prolonging the service life of the display products.

SUMMARY OF THE INVENTION

The present disclosure aims to provide a flexible display panel to reduce stress of metal wires in the bending region, thereby increasing its flexibility and prolonging the service life of the display products.

The disclosure further provides a manufacturing method of the flexible display panel to reduce stress of metal wires in the bending region, thereby increasing its flexibility and prolonging the service life of the display products.

In order to achieve above-mentioned objectives, the present disclosure provides flexible display panel, comprising a display region located in a middle region, a binding region located on an outer side of the display region, and a bending region located between the display region and the binding region, wherein the flexible display panel comprises an organic insulating layer and a metal layer arranged on the organic insulating layer.

wherein a plurality of protrusions are arranged in the organic insulating layer of the bending region, such that a surface of the organic insulating layer comprises concave and convex shapes in the bending region;

wherein the metal layer comprises a plurality of metal wires that pass through the bending region, each of the metal wires is configured to cover a part of the protrusions, and the surface of each of the metal wires is correspondingly concave and convex along with the organic insulating layer.

In an embodiment of the flexible display panel, each of the protrusions is a shape selected from a group consisting of a spherical shape, a square column, a rhombus column, a trapezoid column, an overlapped body of the square column, an overlapped body of the rhombic column, and an overlapped body of the trapezoid column;

wherein shapes of the protrusions are the same, or the protrusions comprise more than two different shapes.

In an embodiment of the flexible display panel, the organic insulating layer is made of a material of acrylic resin, epoxy resin, or polycarbonate resin.

In an embodiment of the flexible display panel, the metal layer is made of a material that is selected from a group consisting of molybdenum (Mo), chromium (Cr), titanium (Ti), nickel (Ni), copper (Cu), silver (Ag), magnesium (Mg), and the combinations;

wherein a structure of the metal layer is a single-layer structure or a laminated structure composed of more than two kinds of metals.

In an embodiment of the flexible display panel, the protrusions are uniformly arranged in the bending region;

wherein density of the protrusions in the bending region is gradually reduced from the middle region of the bending region to the display region and the binding region on two sides of the bending region.

The disclosure further provides a manufacturing method of a flexible display panel, wherein the flexible display panel is divided into a display region located in a middle region, a binding region located on an outer side of the display region, and a bending region located between the display region and the binding region, the manufacturing method comprising the steps of:

at a step S1, forming an organic insulating layer, wherein the organic insulating layer is patterned and a plurality of protrusions are formed in the bending region, such that a surface of the organic insulating layer comprises concave and convex shapes in the bending region; and at a step S2, depositing and patterning the organic insulating layer to form a metal layer, wherein the metal layer comprises a plurality of metal wires that pass through the bending region, each of the metal wires is configured to cover a part of the protrusions, and the surface of each of the metal wires is correspondingly concave and convex along with the organic insulating layer.

In an embodiment of the manufacturing method of the flexible display panel, in the step S1, each of the protrusions is a shape selected from a group consisting of a spherical shape, a square column, a rhombus column, a trapezoid column, an overlapped body of the square column, an overlapped body of the rhombic column, and an overlapped body of the trapezoid column;

wherein shapes of the protrusions are the same, or the protrusions comprise more than two different shapes.

In an embodiment of the manufacturing method of the flexible display panel, in the step S1, the organic insulating layer is made of a material of acrylic resin, epoxy resin, or polycarbonate resin.

In an embodiment of the manufacturing method of the flexible display panel, in the step S2, a dry etching step is used for patterning the organic insulating layer to form the metal layer;

wherein the metal layer is made of a material that is selected from a group consisting of molybdenum (Mo), chromium (Cr), titanium (Ti), nickel (Ni), copper (Cu), silver (Ag), magnesium (Mg), and the combinations;

wherein a structure of the metal layer is a single-layer structure or a laminated structure composed of more than two kinds of metals.

In an embodiment of the manufacturing method of the flexible display panel, in the step S1, the protrusions are uniformly arranged in the bending region;

wherein density of the protrusions in the bending region is gradually reduced from the middle region of the bending region to the display region and the binding region on two sides of the bending region.

The present disclosure has the advantages: the flexible display panel includes an organic insulating layer and a metal layer arranged on the organic insulating layer. The flexible display panel is divided into a display region located in the middle region, a binding region located on an outer side of the display region, and a bending region located between the display region and the binding region. A plurality of protrusions are arranged in the organic insulating layer of the bending region, such that a surface of the organic insulating layer includes concave and convex shapes in the bending region. The metal layer includes a plurality of metal wires that pass through the bending region, each of the metal wires is configured to cover a part of the protrusions, and the surface of each of the metal wires is correspondingly concave and convex along with the organic insulating layer. When the flexible display panel is operated by a bending process, the protrusions can release a part of stress for relieving the stress of the whole bending region to reduce bending cracks of the metal wires. Therefore, the effect of the narrow border is achieved and the service life of the display panel device is increased. In an embodiment of a manufacturing method of the flexible display panel, a plurality of protrusions are arranged in the organic insulating layer of the bending region, such that a surface of the organic insulating layer includes concave and convex shapes in the bending region. The organic insulating layer is deposited and patterned to form a metal layer. The metal material of the metal layer is deposited along the protrusions in the lower layer during the manufacturing method, such that each of the metal wires in the upper layer is configured to cover a part of the protrusions, and the surface of each of the metal wires is correspondingly concave and convex along with the organic insulating layer. When the flexible display panel is operated by a bending process, the protrusions can release a part of stress for relieving the stress of the whole bending region to reduce bending cracks of the metal wires. Therefore, the effect of the narrow border is achieved and the service life of the display panel device is increased.

It should be noted that the exemplary described embodiments are configured to describe and understand the present disclosure, but the present disclosure is not limited thereto.

BRIEF DESCRIPTION OF THE SEVERAL VIEWS OF THE DRAWING(S)

The following embodiments refer to the accompanying drawings for exemplifying specific implementable embodiments of the present disclosure in a suitable computing environment.

wherein the drawings include.

DESCRIPTION OF SPECIFIC EMBODIMENTS OF THE INVENTION

The following embodiments refer to the accompanying figures for exemplifying specific implementable embodiments of the present disclosure in a suitable environment.

Figure 1:
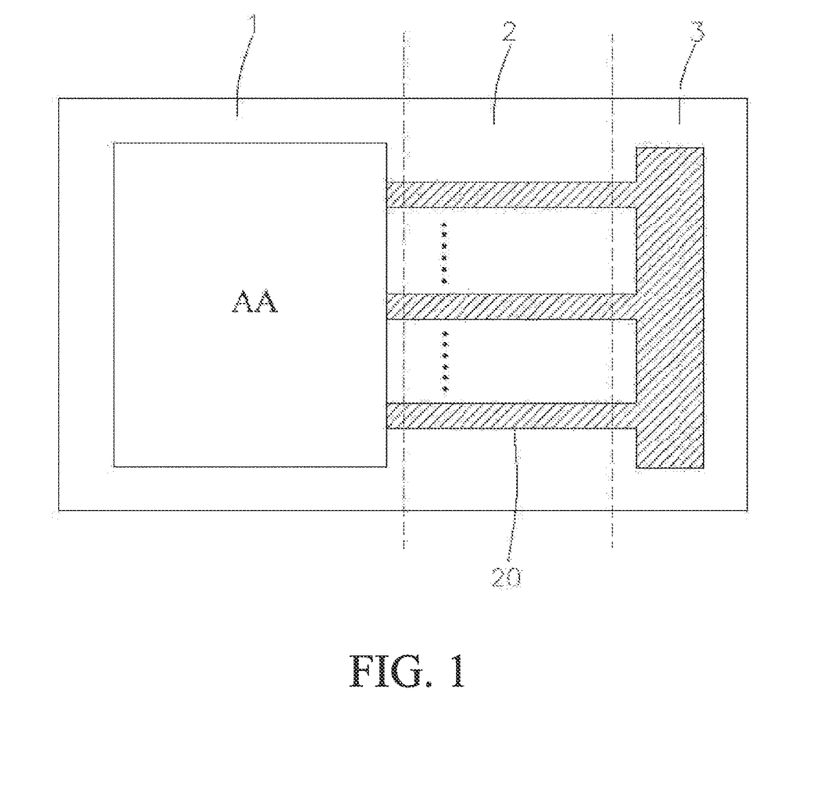
FIG. 1 is a top view of a flexible display panel according to an embodiment of the present disclosure.
Figure 2:
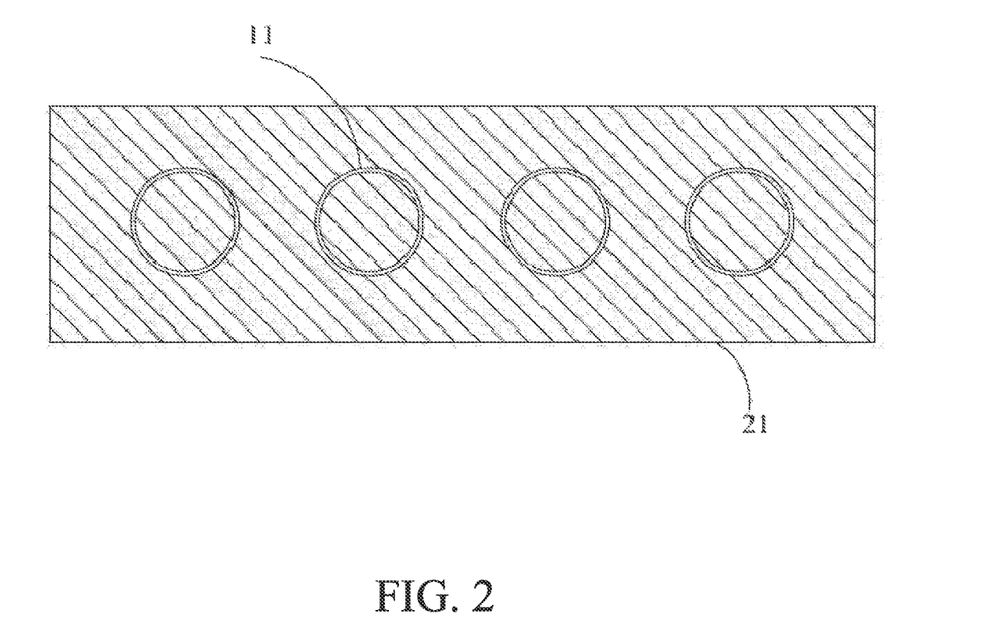
FIG. 2 is a top view of a metal wire in a bending region of a flexible display panel according to a first embodiment of the present disclosure.
Figure 3:
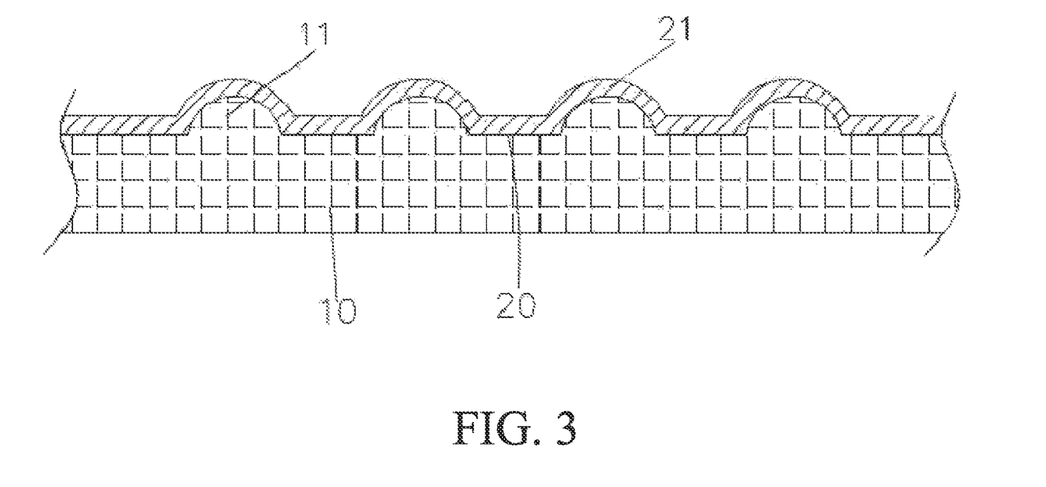
FIG. 3 is a cross-sectional view of a bending region of the flexible display panel according to the first embodiment of the present disclosure.

Referring to FIGS. 1-3, a first embodiment of the present disclosure provides a flexible display panel that is divided into a display region 1 located in the middle region, a binding region 3 located on an outer side of the display region 1, and a bending region 2 located between the display region 1 and the binding region 3. The flexible display panel includes an organic insulating layer 10 and a metal layer 20 arranged on the organic insulating layer 10.

In an embodiment, a plurality of protrusions 11 are arranged in the organic insulating layer 10 of the bending region 2, such that a surface of the organic insulating layer 10 includes concave and convex shapes in the bending region 2.

In an embodiment, the metal layer 20 includes a plurality of metal wires 21 that pass through the bending region 2, each of the metal wires 21 is configured to cover a part of the protrusions 11, and the surface of each of the metal wires 21 is correspondingly concave and convex along with the organic insulating layer 10.

When the flexible display panel provided by the first embodiment of the disclosure is operated by a bending process, the protrusions 11 can release a part of stress for relieving the stress of the whole bending region 2 to reduce bending cracks of the metal wires 21. Therefore, the effect of the narrow border is achieved and the service life of the display panel device is increased.

In an embodiment, the organic insulating layer 10 is made of acrylic resin, epoxy resin, or polycarbonate resin, and is not limited in the first embodiment.

In an embodiment, the metal layer 20 is made of a conductive material, and is selected from a group consisting of molybdenum (Mo), chromium (Cr), titanium (Ti), nickel (Ni), copper (Cu), silver (Ag), magnesium (Mg), and the combinations.

In an embodiment, the structure of the metal layer 20 can be a single-layer structure or a laminated structure composed of more than two kinds of metals, and is not limited in the first embodiment.

In an embodiment, the protrusions 11 are uniformly arranged in the bending region 2 according to an array arrangement mode. In another embodiment, the arrangement can be a distributed arrangement mode, and is not limited in the first embodiment.

In an embodiment, each of the protrusions 11 is a shape selected from a group consisting of a spherical shape, a square column, a rhombus column, a trapezoid column, an overlapped body of the square column, an overlapped body of the rhombic column, and an overlapped body of the trapezoid column. In an embodiment, the shapes of the protrusions 11 are the same, and the shapes of the protrusions 11 are spherical.

Figure 4:
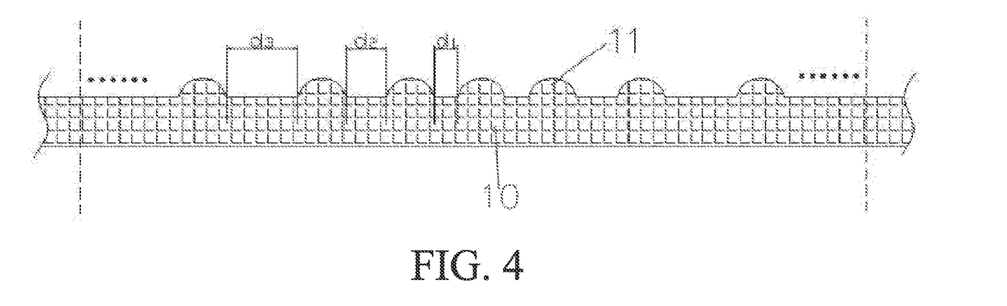
FIG. 4 is a cross-sectional view of an organic insulating layer of the flexible display panel according to a second embodiment of the present disclosure.

Referring to FIG. 4, a second embodiment of the present disclosure provides a flexible display panel. Compared with the first embodiment, the density of the protrusions 11 in the bending region 2 of the second embodiment is gradually reduced from the middle of the bending region 2 to the display region 1 and the binding region 3 on two sides of the bending region 2. Namely, the protrusions 11 in the middle region of the bending region 2 are densely arranged, and the protrusions 11 at the two sides of the bending region 2 are loosely arranged, as shown in FIG. 4. The distance between every two adjacent protrusions 11 is adjusted according to bending radiuses of the flexible display panel in the bending region 2. The relation of bending radiuses is $d1<d2<d3$, where d1, d2, and d3 are defined as the distance between every two adjacent protrusions 11 in a direction from the middle region to the two sides of the bending region 2. Other technical features are the same as those of the first embodiment, and are not described in detail herein.

Figure 5:
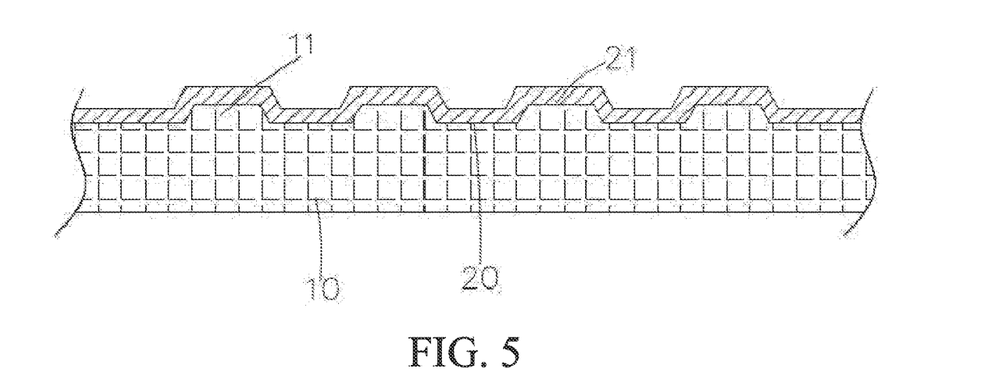
FIG. 5 is a cross-sectional view of a bending region of the flexible display panel according to a third embodiment of the present disclosure.

Referring to FIG. 5, a third embodiment of the present disclosure provides a flexible display panel. Compared with the first embodiment, shapes of the protrusions 11 are a trapezoid column. Other technical features are the same as those of the first embodiment, and are not described in detail herein.

Figure 6:
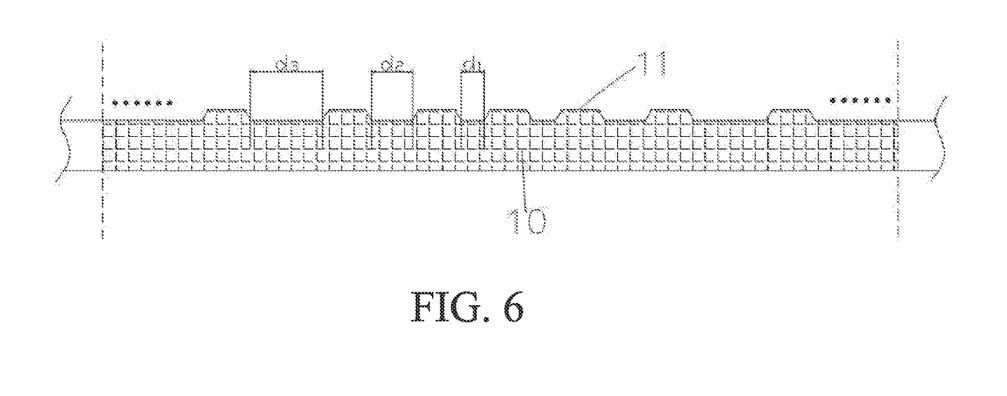
FIG. 6 is a cross-sectional view of an organic insulating layer of the flexible display panel according to a fourth embodiment of the present disclosure.

Referring to FIG. 6, a fourth embodiment of the present disclosure provides a flexible display panel. Compared with the second embodiment, shapes of the protrusions 11 are a trapezoid column. Other technical features are the same as those of the second embodiment, and are not described in detail herein.

Figure 7:
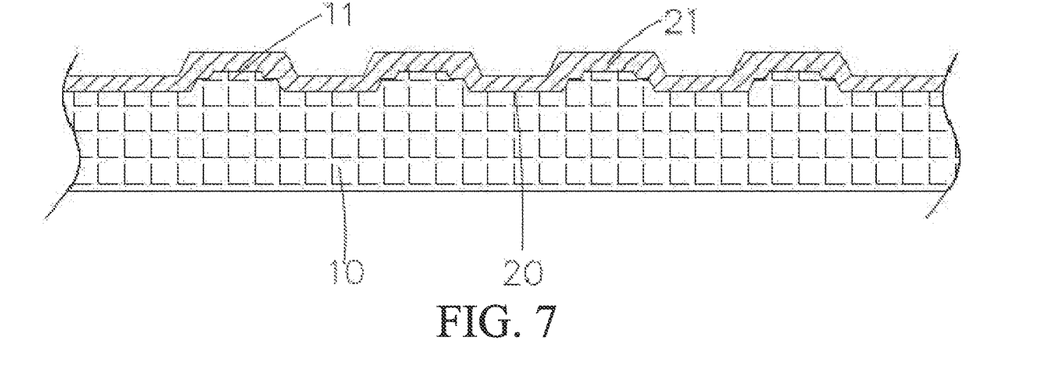
FIG. 7 is a cross-sectional view of a bending region of the flexible display panel according to a fifth embodiment of the disclosure.

Referring to FIG. 7, a fifth embodiment of the present disclosure provides a flexible display panel. Compared with the third embodiment, shapes of the protrusions 11 are an overlapped body of two layers of trapezoidal columns, where the material of the upper trapezoid column can be the same as or different from the material of the lower trapezoid column. The material of the upper trapezoid column can be organic insulating material, such as acrylic resin, epoxy resin, or polycarbonate resin, and is not limited by the fifth embodiment. Other technical features are the same as those of the third embodiment, and are not described in detail herein.

Figure 8:
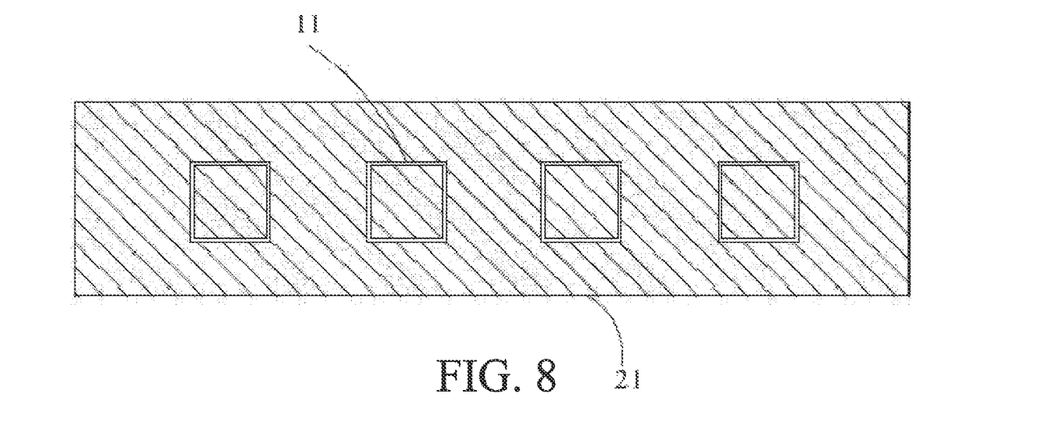
FIG. 8 is a top view of a metal wire in a bending region of the flexible display panel according to a sixth embodiment of the present disclosure.
Figure 9:
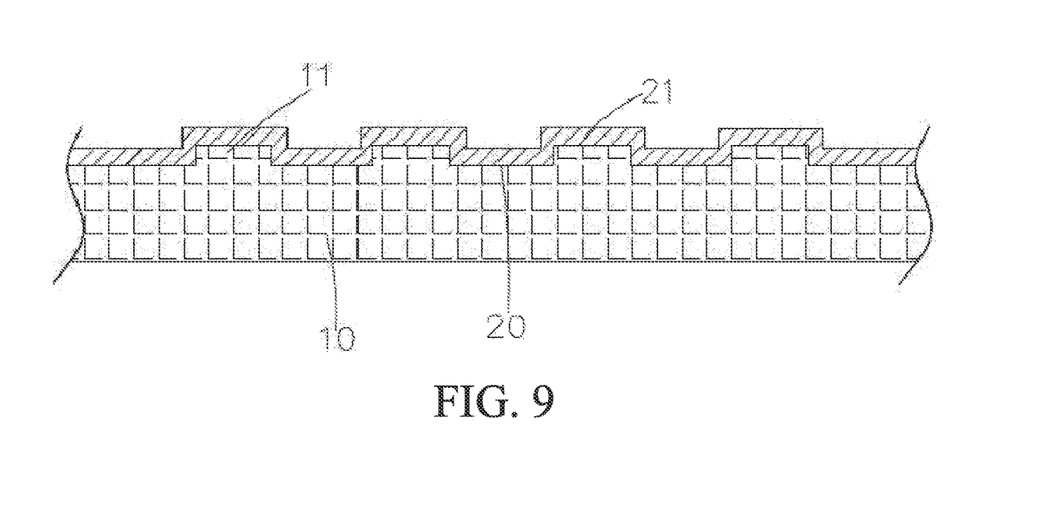
FIG. 9 is a cross-sectional view of a bending region of the flexible display panel according to a sixth embodiment of the present disclosure.

Referring to FIGS. 8-9, a sixth embodiment of the present disclosure provides a flexible display panel. Compared with the first embodiment, shapes of the protrusions 11 are a square column. Other technical features are the same as those of the first embodiment, and are not described in detail herein.

Figure 10:
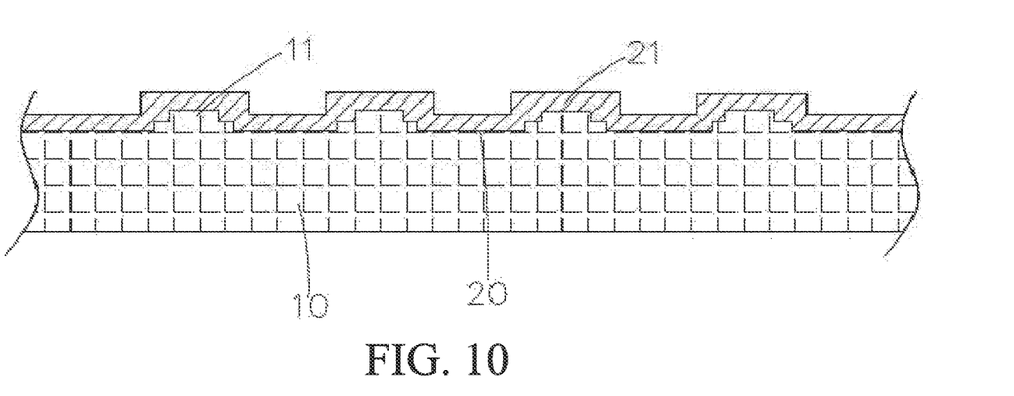
FIG. 10 is a cross-sectional view of a bending region of the flexible display panel according to a seventh embodiment of the present disclosure.

Referring to FIG. 10, a seventh embodiment of the present disclosure provides a flexible display panel. Compared with the sixth embodiment, shapes of the protrusions 11 are an overlapped body of two layers of square columns, where the material of the upper square column can be the same as or different from the material of the lower square column. The material of the upper square column can be organic insulating material, such as acrylic resin, epoxy resin, or polycarbonate resin, and is not limited by the seventh embodiment. Other technical features are the same as those of the sixth embodiment, and are not described in detail herein.

Figure 11:
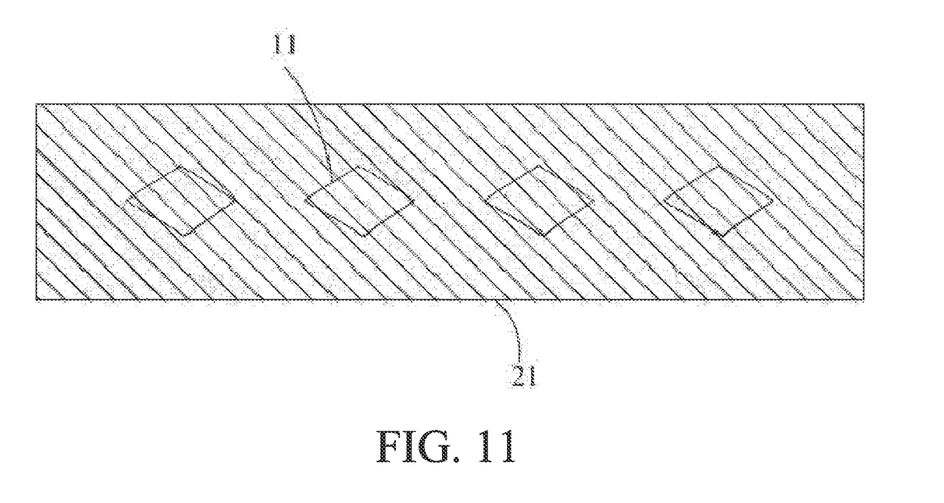
FIG. 11 is a top view of a metal wire in a bending region of the flexible display panel according to an eighth embodiment of the present disclosure.

Referring to FIG. 11, an eighth embodiment of the present disclosure provides a flexible display panel. Compared with the first embodiment, shapes of the protrusions 11 is a rhombus column. Other technical features are the same as those of the first embodiment, and are not described in detail herein.

A ninth embodiment of the present disclosure provides a flexible display panel. Compared with the first embodiment, the protrusions 11 of the organic insulating layer 10 are made of different convex shapes, where the protrusions 11 include more than two different shapes. The shapes of each protrusion 11 is selected from a group consisting of a spherical shape, a square column, a rhombus column, a trapezoid column, an overlapped body of the square column, an overlapped body of the rhombic column, and an overlapped body of the trapezoid column. Other technical features are the same as those of the first embodiment, and are not described in detail herein.

In an embodiment of the present disclosure, a plurality of protrusions 11 are arranged in the organic insulating layer 10 of the bending region 2, such that a surface of the organic insulating layer 10 includes concave and convex shapes in the bending region 2. Each of the metal wires 21 in the upper layer is configured to cover a part of the protrusions 11, and the surface of each of the metal wires 21 is correspondingly concave and convex along with the organic insulating layer 10. When the flexible display panel is operated by a bending process, the protrusions 11 can release a part of stress for relieving the stress of the whole bending region 2 to reduce bending cracks of the metal wires 21. Therefore, the effect of the narrow border is achieved and the service life of the display panel device is increased.

Figure 12:
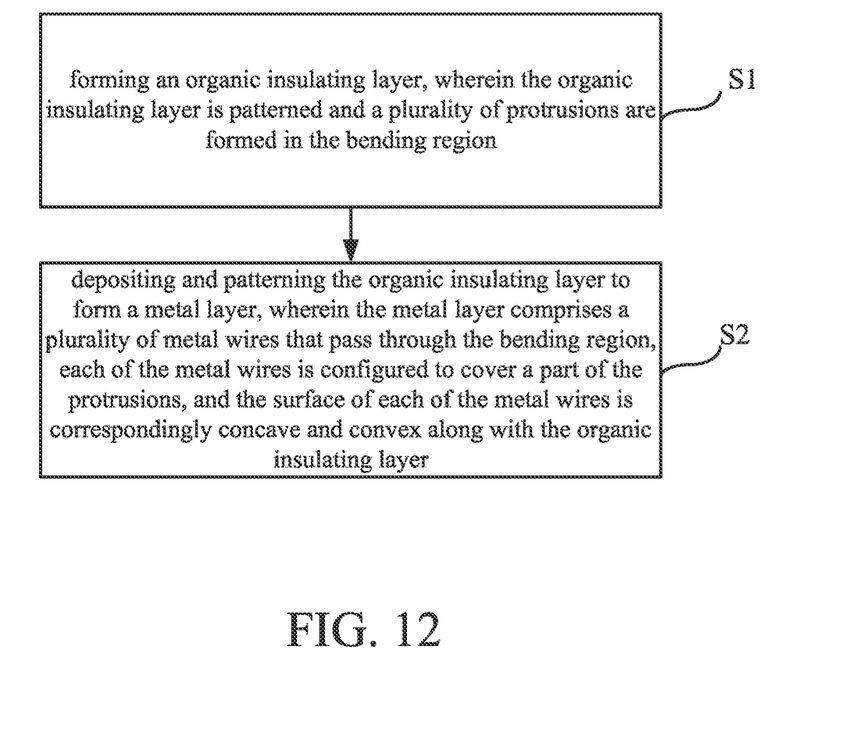
FIG. 12 is a flowchart of a manufacturing method of the flexible display panel according to an embodiment of the disclosure.

In FIG. 12, the present disclosure based on the flexible display panel further provides a manufacturing method of the flexible display panel. The flexible display panel is divided into a display region 1 located in the middle region, a binding region 3 located on an outer side of the display region 1, and a bending region 2 located between the display region 1 and the binding region 3. The manufacturing method includes following steps.

At a step S1, an organic insulating layer 10 is formed. The organic insulating layer 10 is patterned and a plurality of protrusions 11 are formed in the bending region 2, such that a surface of the organic insulating layer 10 includes concave and convex shapes in the bending region 2.

At a step S2, the organic insulating layer 10 is deposited and patterned to form a metal layer 20. The metal layer 20 includes a plurality of metal wires 21 that pass through the bending region 2, each of the metal wires 21 is configured to cover a part of the protrusions 11, and the surface of each of the metal wires 21 is correspondingly concave and convex along with the organic insulating layer 10.

In an embodiment of the step S1, the shapes of the protrusions 11 are the same. In another embodiment, the protrusions 11 of the organic insulating layer 10 are made of different convex shapes, where the protrusions 11 include more than two different shapes.

In an embodiment of the step S1, each of the protrusions 11 is a shape selected from a group consisting of a spherical shape, a square column, a rhombus column, a trapezoid column, an overlapped body of the square column, an overlapped body of the rhombic column, and an overlapped body of the trapezoid column.

In an embodiment of the step S2, processes of patterning the metal layer 20 includes a photo-resist coating step, an exposure step, a developing step, an etching step, and a photoresist removing step, where the etching step of patterning the metal layer 20 is performed by a dry etching process.

In an embodiment of the step S1, the protrusions 11 are uniformly arranged in the bending region 2.

The density of the protrusions 11 in the bending region 2 is gradually reduced from the middle of the bending region 2 to the display region 1 and the binding region 3 on two sides of the bending region 2.

In an embodiment, the organic insulating layer 10 is made of a material of acrylic resin, epoxy resin, or polycarbonate resin, and is not limited in the present disclosure.

In an embodiment, the metal layer 20 is made of a conductive material, and is selected from a group consisting of molybdenum (Mo), chromium (Cr), titanium (Ti), nickel (Ni), copper (Cu), silver (Ag), magnesium (Mg), and the combinations.

In an embodiment, the structure of the metal layer 20 can be a single-layer structure or a laminated structure composed of more than two kinds of metals, and is not limited in the first embodiment.

In an embodiment, the protrusions 11 are uniformly arranged in the bending region 2 according to an array arrangement mode. In another embodiment, the arrangement can be a distributed arrangement mode, and is not limited in the first embodiment.

In an embodiment of a manufacturing method of the flexible display panel, a plurality of protrusions 11 are arranged in the organic insulating layer 10 of the bending region 2, such that a surface of the organic insulating layer 10 includes concave and convex shapes in the bending region 2. The organic insulating layer 10 is deposited and patterned to form a metal layer 20. The metal material of the metal layer 20 is deposited along the protrusions 11 in the lower layer during the manufacturing method, such that each of the metal wires 21 in the upper layer is configured to cover a part of the protrusions 11, and the surface of each of the metal wires 21 is correspondingly concave and convex along with the organic insulating layer 10. When the flexible display panel is operated by a bending process, the protrusions 11 can release a part of stress for relieving the stress of the whole bending region 2 to reduce bending cracks of the metal wires 21. Therefore, the effect of the narrow border is achieved and the service life of the display panel device is increased.

In conclusion, the flexible display panel includes an organic insulating layer and a metal layer arranged on the organic insulating layer. The flexible display panel is divided into a display region located in the middle region, a binding region located on an outer side of the display region, and a bending region located between the display region and the binding region. A plurality of protrusions are arranged in the organic insulating layer of the bending region, such that a surface of the organic insulating layer includes concave and convex shapes in the bending region. The metal layer includes a plurality of metal wires that pass through the bending region, each of the metal wires is configured to cover a part of the protrusions, and the surface of each of the metal wires is correspondingly concave and convex along with the organic insulating layer. When the flexible display panel is operated by a bending process, the protrusions can release a part of stress for relieving the stress of the whole bending region to reduce bending cracks of the metal wires. Therefore, the effect of the narrow border is achieved and the service life of the display panel device is increased. In an embodiment of a manufacturing method of the flexible display panel, a plurality of protrusions are arranged in the organic insulating layer of the bending region, such that a surface of the organic insulating layer includes concave and convex shapes in the bending region. The organic insulating layer is deposited and patterned to form a metal layer. The metal material of the metal layer is deposited along the protrusions in the lower layer during the manufacturing method, such that each of the metal wires in the upper layer is configured to cover a part of the protrusions, and the surface of each of the metal wires is correspondingly concave and convex along with the organic insulating layer. When the flexible display panel is operated by a bending process, the protrusions can release a part of stress for relieving the stress of the whole bending region to reduce bending cracks of the metal wires. Therefore, the effect of the narrow border is achieved and the service life of the display panel device is increased.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A flexible display panel, comprising a display region located in a middle region, a binding region located on an outer side of the display region, and a bending region located between the display region and the binding region, wherein the flexible display panel comprises an organic insulating layer and a metal layer arranged on the organic insulating layer;
   wherein a plurality of protrusions are arranged in the organic insulating layer of the bending region, such that a surface of the organic insulating layer comprises concave and convex shapes in the bending region;
   wherein the metal layer comprises a plurality of metal wires that pass through the bending region, each of the metal wires is configured to cover a part of the protrusions, and the surface of each of the metal wires is correspondingly concave and convex along with the organic insulating layer; and
   wherein density of the protrusions in the bending region is gradually reduced from a middle of the bending region to each of two sides of the bending region.

2. The flexible display panel according to claim 1, wherein each of the protrusions is a shape selected from a group consisting of a spherical shape, a square column, a rhombus column, a trapezoid column, an overlapped body of the square column, an overlapped body of the rhombic column, and an overlapped body of the trapezoid column;
   wherein shapes of the protrusions are the same, or the protrusions comprise more than two different shapes.

3. The flexible display panel according to claim 1, wherein the organic insulating layer is made of a material of acrylic resin, epoxy resin, or polycarbonate resin.

4. The flexible display panel according to claim 1, wherein the metal layer is made of a material that is selected from a group consisting of molybdenum (Mo), chromium (Cr), titanium (Ti), nickel (Ni), copper (Cu), silver (Ag), magnesium (Mg), and the combinations;
   wherein a structure of the metal layer is a single-layer structure or a laminated structure composed of more than two kinds of metals.

5. A manufacturing method of a flexible display panel, wherein the flexible display panel is divided into a display region located in a middle region, a binding region located on an outer side of the display region, and a bending region located between the display region and the binding region, the manufacturing method comprising:
   forming an organic insulating layer, wherein the organic insulating layer is patterned and a plurality of protrusions are formed in the bending region, such that a surface of the organic insulating layer comprises concave and convex shapes in the bending region; and
   depositing and patterning the organic insulating layer to form a metal layer, wherein the metal layer comprises a plurality of metal wires that pass through the bending region, each of the metal wires is configured to cover a part of the protrusions, and the surface of each of the metal wires is correspondingly concave and convex along with the organic insulating layer,
   wherein density of the protrusions in the bending region is gradually reduced from a middle of the bending region to each of two sides of the bending region.

6. The manufacturing method of the flexible display panel according to claim 5, wherein each of the protrusions is a shape selected from a group consisting of a spherical shape, a square column, a rhombus column, a trapezoid column, an overlapped body of the square column, an overlapped body of the rhombic column, and an overlapped body of the trapezoid column;
   wherein shapes of the protrusions are the same, or the protrusions comprise more than two different shapes.

7. The manufacturing method of the flexible display panel according to claim 5, wherein the organic insulating layer is made of a material of acrylic resin, epoxy resin, or polycarbonate resin.

8. The manufacturing method of the flexible display panel according to claim 5, wherein a dry etching is used for patterning the organic insulating layer to form the metal layer;
   wherein the metal layer is made of a material that is selected from a group consisting of molybdenum (Mo), chromium (Cr), titanium (Ti), nickel (Ni), copper (Cu), silver (Ag), magnesium (Mg), and the combinations;
   wherein a structure of the metal layer is a single-layer structure or a laminated structure composed of more than two kinds of metals.

* * * * *